US005088010A

United States Patent [19]

Wimmer et al.

[11] Patent Number: 5,088,010

[45] Date of Patent: Feb. 11, 1992

[54] FASTENING MEANS FOR A TRANSFORMER MODULE AND A SIGNAL GENERATOR FOR MOUNTING AT A SIGNAL TOWER

[75] Inventors: Walter Wimmer, Pullach; Herbert Krautwald; Guenter Heinzel, both of Munich, all of Fed. Rep. of Germany

[73] Assignee: Siemens Aktiengesellschaft, Munich, Fed. Rep. of Germany

[21] Appl. No.: 589,787

[22] Filed: Sep. 26, 1990

[30] Foreign Application Priority Data

Oct. 31, 1989 [DE] Fed. Rep. of Germany ... 8912886[U]

[51] Int. Cl.[5] ............ H05K 7/02

[52] U.S. Cl. ............ 361/419; 361/417; 336/67; 336/68; 174/45 R

[58] Field of Search ............ 361/417, 419, 420, 386, 361/387, 388, 380, 426, 428, 331; 340/908, 916; 363/141; 116/63 R; 336/67, 68; 174/45 R

[56] References Cited

U.S. PATENT DOCUMENTS

| | | | |
|---|---|---|---|
| 3,257,642 | 6/1966 | Lazerges | 340/916 |
| 4,307,264 | 12/1981 | Hess | 361/417 X |
| 4,448,444 | 5/1984 | Toussaint | 361/417 X |
| 4,754,390 | 6/1988 | Felton et al. | 361/388 X |

FOREIGN PATENT DOCUMENTS

| | | | |
|---|---|---|---|
| 1295426 | 5/1969 | Fed. Rep. of Germany | 340/908 |
| 3230761 | 2/1984 | Fed. Rep. of Germany . | |
| 8715847 | 3/1989 | Fed. Rep. of Germany . | |
| 8715848 | 3/1989 | Fed. Rep. of Germany . | |
| Hill, Van Santen, Steadman & Simpson | 5/1989 | Fed. Rep. of Germany . | |

*Primary Examiner*—Leo P. Picard
*Assistant Examiner*—Paramita Ghosh
*Attorney, Agent, or Firm*—Hill, Van Santen, Steadman & Simpson

[57] ABSTRACT

Fastening mechanism for a transformer module and a signal generator for mounting at a signal tower.

A bottom pan is provided having a multi-use holder, a receptacle for a transformer module, and a holding structure with a cable opening for a signal generator. The pan is mated with a cover forming a terminal space, a terminal block being arranged in this terminal space. The transformer module has catch hooks which are secured to corresponding catch noses in the receptacle. The transformer module comprises a transformer, a rectifier, and a lead. The applied multi-use holder comprises a U-shaped cable channel region communicating with a cable lead-through opening in the side wall of the bottom pan. A cable wind-up structure is provided in the terminal space. The cover is held to the pan by at least one catch nose and one catch tongue that are applied to the bottom pan and that engage into corresponding recesses in the cover.

20 Claims, 3 Drawing Sheets

FASTENING MEANS FOR A TRANSFORMER MODULE AND A SIGNAL GENERATOR FOR MOUNTING AT A SIGNAL TOWER

BACKGROUND OF THE INVENTION

The invention is directed to a fastening means for a transformer module and a signal generator for mounting at a signal tower. Fastenings for signal generators at a signal tower are known. German Utility Model G 89 02 750 discloses a combined mount that serves the purpose of fastening a signal generator to a signal tower for traffic light signal systems.

Since traffic light signal systems are being decentralized to an increasing degree and are operated with low-volt technology, it is required to undertake the voltage conversion in the region of the signal generator. In low-volt technology, a separate transformer having a corresponding fastening was arranged in the respective signal generator chamber for every chamber, as disclosed, for example, in German Utility Model G 87 15 847. A separate post block or terminal block having plugs was respectively required per light signal generator chamber for that purpose (German Utility Model 87 15 848). In such traffic signal systems, the cabling ensued star-like from the node control means to the respective signal towers or, respectively, signal generators.

German published application DE-OS 32 30 761 already discloses a traffic signal system wherein every signal generator is fed via a single two-lead line and is supplied with a separate control line for switching the individual signal lamps. The installation therein disclosed is designed to reduce and simplify the cables required, particularly at junctions and traffic control points with numerous traffic signal units. Each unit (1, 2) contains in a single housing the customary red (3) green (4) and amber (5) lamps, each of which is connected (11) through an individual switch (7) to the secondary side of a transformer (8) and also to a switching instrument (12). The transformer steps down the main voltage to a suitable voltage in the range 6 to 60 volts for the lamps. The switching instrument in each unit operates the lamp switches (7), receives switching signals and delivers lamp power circuit status signals to the central control unit (6) through a connecting signal lead (13). Preferably the second lead of a dual-lead connection between the switching and control instruments is provided by the zero lead (10) of the dual-lead power connection to the unit. The transformer primary winding is coupled by wires (9, 10) to the main supply (14) and the transformer reduces the voltage to a 12 volt supply. Operation of the selected lamp is effected by commands from the control activating the switch stage (12). This disclosed system is thereby operated in low-volt technology.

In modern traffic light signal systems, a transformer should be provided for the voltage conversion, together with rectifier and appertaining components for a plurality of signal generators or, respectively, signal generator combinations, potentially for all signal generator combinations of a signal generator tower.

SUMMARY OF THE INVENTION

It is therefore an object of the invention to create a fastening means for a signal generator that enables a power supply unit to be attached, enables a wiring or, respectively, connection chamber to be formed, and also guarantees a simple fastening or, respectively, mounting possibility at the signal tower.

This object is inventively achieved with a fastening means that comprises the following features:

a) A bottom trough or pan, having an applied multi-purpose holder and having a receptacle means for a transformer module as well as having a holding means and a cable opening for the signal generator, forms a post space or terminal space together with a cover in which a post block or terminal block is arranged;

b) The transformer module is secured with appertaining catch hooks thereon, being secured at corresponding catch noses in the receptacle means;

c) The transformer module comprises a transformer, rectifier and a lead;

d) The applied multi-purpose holder for mounting the fastening means to a signal tower comprises a cable channel region fashioned U-shaped, having a cable lead-through opening in the side wall of the bottom trough;

e) A cable wind-up means is provided in the terminal space;

f) The cover is held by at least one catch nose and one catch tongue which are applied to the bottom pan and engage into corresponding recesses of the cover.

In addition to allowing the connection of the actual signal generator that is usually composed of three signal generator chambers, the fastening means of the invention also allows the connection of a transformer module that undertakes the voltage conversion for a plurality of signal generators. Further, a post space or terminal space is created by this fastening means, the supply cable being preferably clamped in this terminal space and the signal generator cable that is likewise introduced thereunto is guided and may be potentially wound up in said terminal space.

The signal generator can be mounted at and secured to the signal tower, either at the head end or at a longitudinally proceeding tower such as a whip tower in the proven, traditional way with the multi-use holder applied with the fastening means.

In particular, the invention provides an advantageous embodiment of a fastening means for a transformer module and a signal generator, for mounting at a signal tower. For weatherproofing, the bottom pan (1) proceeds obliquely in the region of the cable lead-through opening (1*d*) and forms a sloping connecting floor (1*k*). The receptacle means (1*b*) is arranged under the sloping connecting floor (1*k*). A sealant (11) is arranged in the terminal space or post space in the region of the cable lead-through opening (1*d*). The cable wind-up means (1*e*) is advantageously formed by a pipe section that can be slotted and is applied to the bottom pan (1) over the cylindrical holding means (1*n*). A further sealant (8) is arranged in the post space in the region of the wind-up means (1*e*). Additionally, the transformer module (2) is sealed with a casting compound (2*h*). The cover (3) is held to the bottom pan (1) by a catch tongue (1*q*) which can be conveniently unlocked with a tool (12). A seal (3*a*) is applied between the cover and the bottom pan. These various sealing arrangements provide for weather resistance and provide a barrier against insect infiltration.

The advantages and the further development of the invention derive from the description of the invention with reference to an exemplary embodiment with appertaining drawings.

DETAILED DESCRIPTION OF THE PREFERRED EMBODIMENTS

Figure 1:
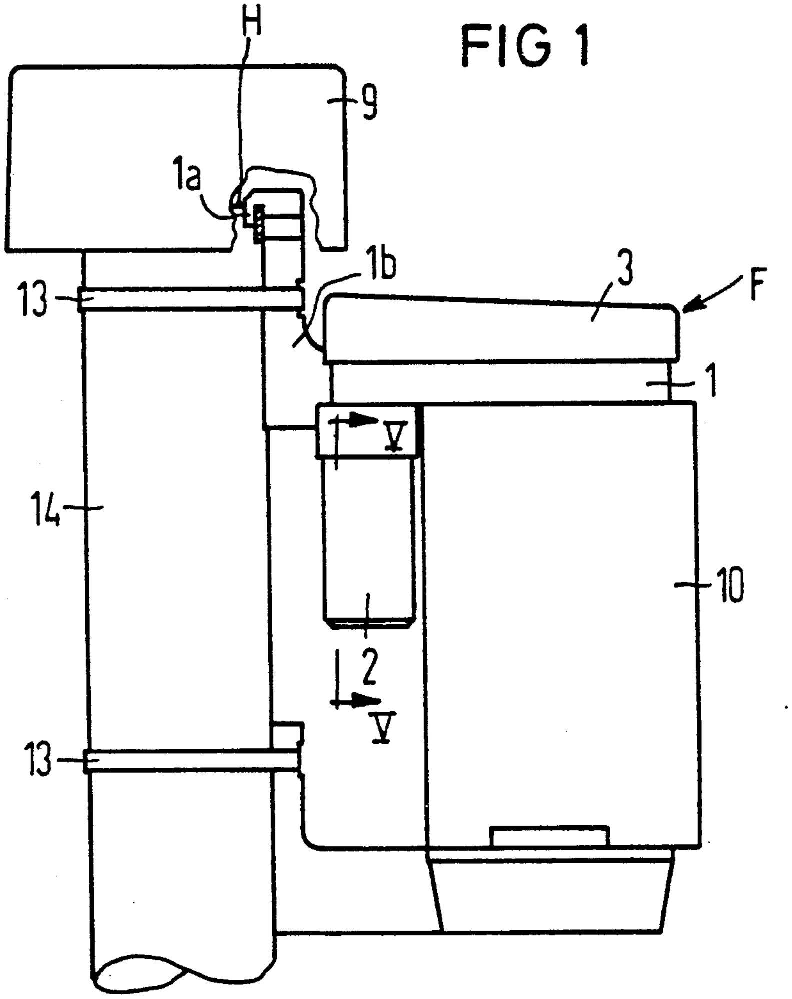
FIG. 1 is an elevational view of the fastening means with signal generator and transformer module at the signal tower.

FIG. 1 shows a fastening means F that is formed by a cover 3, a bottom pan 1 and the multi-use holder 1*b*. The bottom pan has perimeter sidewalls 1' and the cover has overlapping sidewalls 3' FIG. 1 shows the transformer module 2. The fastening means F is secured to a head end H of the signal tower 14 with the multi-use holder 1*b*, and with strap retainers 13. The fastening means F thereby has a fastening hook 1*a* hooked to the head end of the tower 14. The head end of the signal tower 14 is covered with a tower hood 9. A signal generator 10 has its upper end secured to the fastening means F of the invention. A lower end of the signal generator 10 is additionally fixed to the signal tower with the separate second multi-use holder in a known way with a strap retainer 13.

Figure 2:
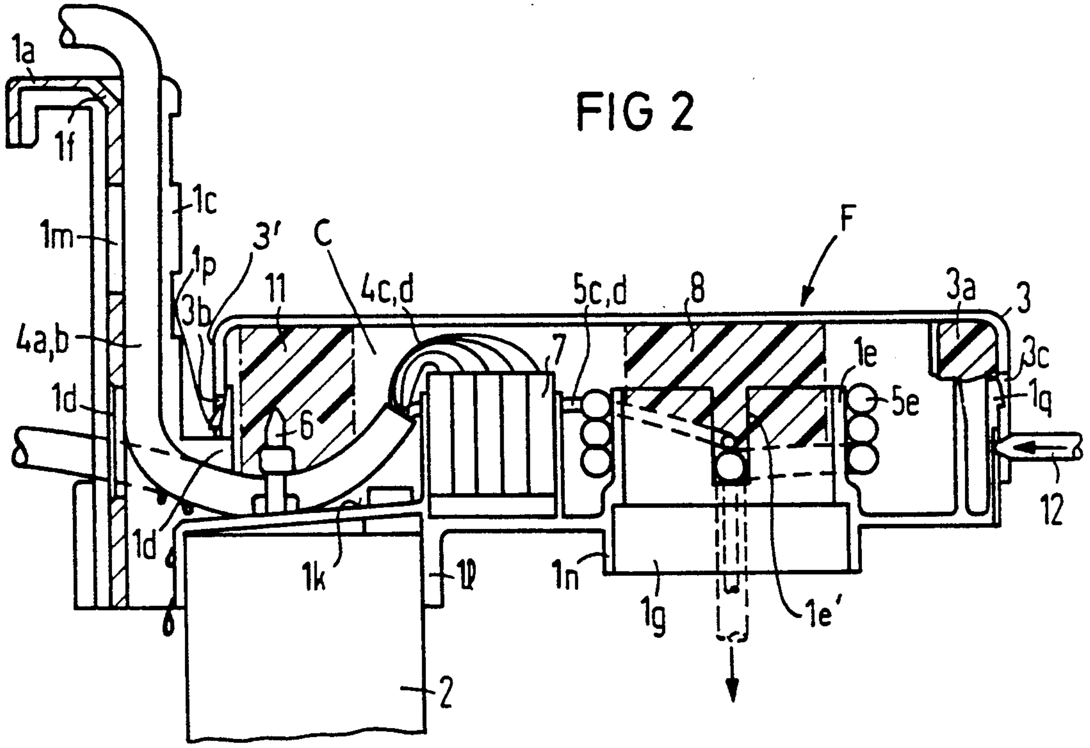
FIG. 2 is a partial sectional view of the fastening means of FIG. 1.
Figure 3:
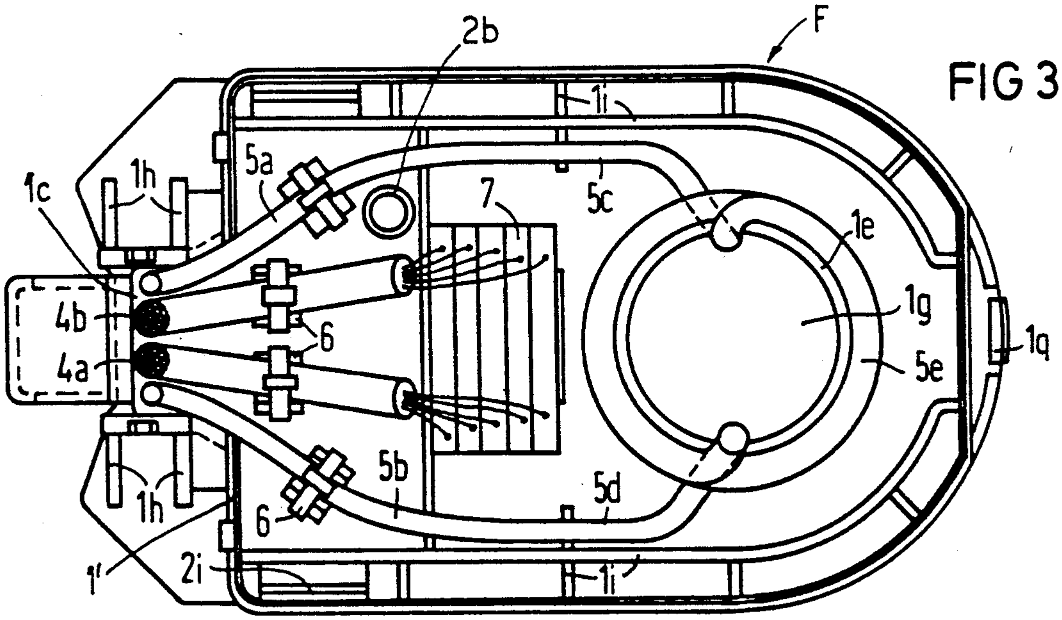
FIG. 3 is a plan view of the fastening means of FIG. 1 with the cover removed for clarity.

According to FIGS. 2 and 3, the fastening means F of the invention comprises a bottom pan 1 that has the applied multi-use holder 1*b* with the fastening hook la and a rated break point 1*f* at one end. The rated break point 1*f* serves the purpose of knocking the fastening hook 1*a* off (separating the fastening hook 1*a* from the holder 1*b*) when the fastening means is not to be secured to the head end of a signal tower but is to be secured proceeding longitudinally at the signal tower, for example at a whip tower. The multi-use holder 1*b* comprises a channel region 1*c* fashioned U-shaped through which the supply or, respectively, signal generator cable 4*a*, 4*b* or, respectively, cables 5*a*, 5*b* that come from the signal generator tower are guided. The bottom pan 1 is terminated with a cover 3 attached via catch mechanisms (described below) and forms a post space or terminal space or terminal chamber C with the cover 3 in which a post block or terminal block 7 is arranged. The cable ends 4*c*, 4*d* of the supply cable are connected thereto. The interlocking of the cover can ensue, for example, with a catch nose 1*p* mating with a corresponding recess 3*b* in the cover, and with a catch tongue 1*q* mating with a corresponding recess 3*c* in the cover 3, whereby the catch nose and catch tongue are applied to the bottom pan 1. The catch tongue 1*q* can expediently be disengaged with a tool 12.

The supply cable 4*a*, 4*b* that, for example, can comprise a power line having a cross-section of three times 1.5 $mm^2$ and that can comprise an integrated coaxial cable having a cross-section of 0.5 $mm^2$, is conducted through the cable lead-through opening 1*d* in the sidewalls 1' of the bottom pan 1. In this region, the bottom pan 1 comprises an obliquely proceeding pan floor that forms a slanting connecting floor 1*k*. The slanting floor is arranged such that the introduced cables 4*a*, 4*b* necessarily have their cable ends 4*c*, 4*d* rising in upward direction, so that no rain water can penetrate to the terminals. The cables 5*a*, 5*b* that come from the signal generator tower would also be similarly inclined, rising in an upward direction, in the region above the connecting floor 1*k*. The supply and signal generator cables 4*a*, 4*b*; 5*a*, 5*b* are expediently secured to the connecting floor 1*k* with cable clips 6. Rain water that may penetrate the cover 3 runs down the connecting floor 1*k* to the signal generator tower and can thereby drip off.

Under the sloping connecting floor 1*k*, the bottom pan 1 comprises a receptacle means 1*l* for the transformer module 2 that is secured very protected by this arrangement. A holding means 1*n* for the signal generator (signal generator not shown in FIG. 2) is also provided in the bottom pan 1, whereby the holding means 1*n* is generally cylindrically fashioned. A cable wind-up means or pipe section 1*e* is advantageously formed immediately thereabove, this means being expediently formed as a cylindrical piece with slotted sections 1*e*' for passing the cables into or out of the wind-up means 1*e*. An excess length of the signal generator cable 5*e* can be wound up around the wind-up means le so that only the necessary end is to be guided to the individual signal generator chambers.

A cover seal 3*a*, for example, is provided in and around an inner cover edge, such as the overlapping sidewalls 3', in order to protect the terminal space C against the penetration of rain and insects. A sealant 11 is applied in the region of the cable lead-through opening 1*d*, this sealant being formed by a block of expanded cellular material. A further sealant, for example a plug 8 of expanded cellular material is also arranged above or, respectively, in the pipe section 1*e*, this preventing the penetration of insects into the signal generator chambers.

The fastening means F of the invention is shown in a plan view in FIG. 3. It may also be seen herein that the floor pan 1 of the fastening means F comprises reinforcing ribs or gusset plates 1*h*, which can be triangularly-shaped, in the region of the multi-use holder 1*b*. Additional reinforcing ribs are also applied to the sidewalls of the bottom pan 1, these ribs being referenced 1*i*.

Figure 4:
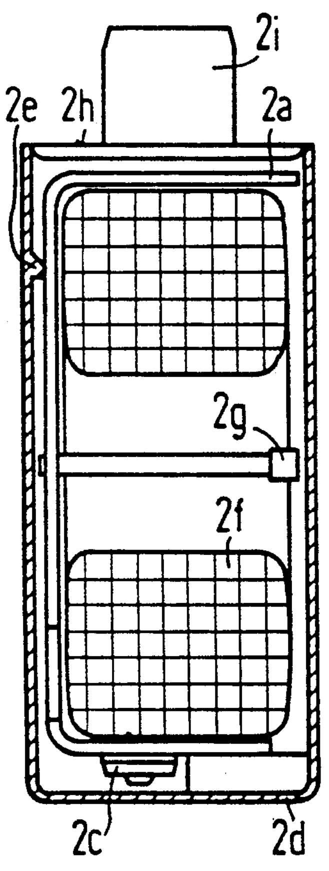
FIG. 4 is a partial sectional view of the transformer module viewed generally along line IV—IV of FIG. 5.
Figure 5:
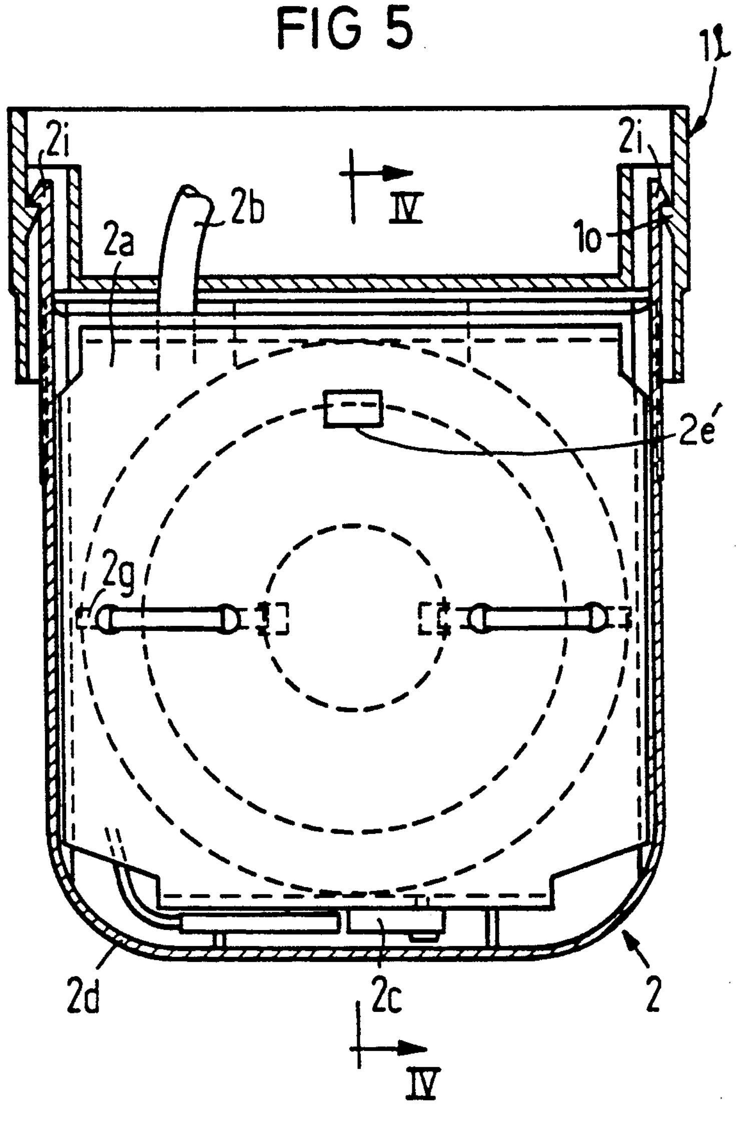
FIG. 5 is a sectional view of the transformer module, viewed generally along line V—V of FIG. 1.

FIGS. 4 and 5 show the transformer module 2 in a section from two different sides. The transformer module 2 comprises a housing 2*d* that is referred to as a transformer "can". The transformer module 2 is latched with at least two catch hooks 2*i* to corresponding catch noses 1*o* of the bottom pan 1, being latched thereto in the receptacle means 1*l*. A lead 2*b* is conducted from the transformer module 2 into the terminal chamber C of the fastening means F. As an example, the transformer 2*f* is secured to the heat-conducting plate 2*a* with a cable coupler 2*g*. The head-conducting plate 2*a* itself is secured to a catch nose 2*e* of the transformer can 2*d* with an opening 2*e*' provided for that purpose. The rectifier or rectifiers 2*c* are expediently attached to the heat-conducting plate 2*a* with, for example, screws. For heat and climate resistance, the transformer module is protected against environmental influences with a casting compound 2*h*.

Existing signal generators can be retrofitted at the signal tower at any time with a fastening means of the invention.

Although various minor changes and modifications might be proposed by those skilled in the art, it will be understood that we wish to include within the claims of the patent warranted hereon all such changes and modifications as reasonably come within our contribution to the art.

We claim as our invention:

1. A fastening mechanism for mounting a signal generator to a signal tower, said signal generator having cables to be routed to said signal tower, comprising:

a transformer module;

a bottom pan, having:

sidewalls, a floor, said sidewalls extending from said floor, a receptacle means mounted to said floor for mounting the transformer module to said bottom pan, and a holding means mounted to said floor for mounting the signal generator to said bottom pan;

a cover installed onto said bottom pan, forming a terminal space together with said pan, said pan providing an access for said cables to be routed from said signal generator into said terminal space;

a terminal block arranged in said terminal space;

a holder applied to said pan and fastenable to said signal tower, said holder comprising a cable channel region for guiding said cables from said terminal space to said signal tower; and said sidewalls having an open area communicating with said channel region forming a cable pathway extending from said signal tower through said cable channel region, through said open area, into said terminal space, to said terminal block.

2. A fastening mechanism according to claim 1 wherein said transformer module comprises at least one catch hook and said receptacle means comprises at least one catch nose, said catch hook engaging said catch nose for securing the transformer module to said receptacle means.

3. A fastening mechanism according to claim 1 wherein said holding means provides a cable opening therethrough for communicating cables from said signal generator into said terminal space, and a cable wind-up means to store excess cable length inside said terminal space.

4. A fastening mechanism according to claim 3 wherein said holding means comprises a cylindrically shaped sleeve for mounting the signal generator therein, and said cable wind-up means comprises a pipe section shape having at least one slot formed in said pipe section shape, said pipe section shape located inside said terminal space, and said pipe section shape axially aligned with, and open to, said cylindrically shaped sleeve, excess cable being wound around an outer circumference of said pipe section shape with at least one cable traversing from outside of said pipe section shape to inside of said pipe section shape through said slot, and down through said cylindrically shaped sleeve and into said signal generator.

5. A fastening mechanism according to claim 3 further comprising a signal generator seal arranged in the terminal space, in said cable opening, to seal said signal generator from said terminal space.

6. A fastening mechanism according to claim 1 wherein said floor comprises a sloping connecting floor means for draining water entering through said open area of said side walls out of said terminal space.

7. A fastening mechanism according to claim 6 wherein said sloping connecting floor means comprises a sloping floor portion arranged inside said terminal space in a region adjacent to said open area of said sidewalls, said sloping floor portion directing water deposited thereon to run off out of said terminal space through said open area.

8. A fastening mechanism according to claim 7 wherein said receptacle means is located beneath said sloping floor portion.

9. A fastening mechanism according to claim 1 wherein the cable channel region is fashioned U-shaped in cross section for guiding cables within the cross section.

10. A fastening mechanism according to claim 1 further comprising a peripheral cover seal arranged between said cover and said pan.

11. A fastening mechanism according to claim 1 further comprising an entry seal arranged in the terminal space, adjacent to said open area of said sidewalls to seal said terminal space from said open area.

12. A fastening mechanism according to claim 1 further comprising at least one strap retainer for attaching said holder to said signal tower.

13. A fastening mechanism according to claim 1 wherein the transformer module comprises:

a transformer;

a rectifier;

a lead;

a heat-conducting plate; and a housing, said heat-conducting plate interlocked to said housing, said rectifier and said transformer are secured to said heat-conducting plate, and said lead proceeding from said housing through said receptacle means and into said terminal space.

14. A fastening mechanism according to claim 1 wherein the transformer module is sealed with a casting compound.

15. A fastening mechanism according to claim 1 wherein said signal tower provides an edge portion and said holder comprises a first multi-use holder comprising:

an elongated body portion having a base end and a distal end, connected at said base end to said pan;

a hook portion connected to said distal end of said elongated body portion, said hook portion curling over on a side of said elongated body portion toward said signal tower, said hook portion engaged over said edge portion of said signal tower, said hook portion curling downward to hold said holder onto said signal tower in a hanging fashion; and said elongated body portion laterally clamped to said signal tower by at least one strap retainer.

16. A fastening mechanism according to claim 15 wherein said hook portion is connected to said elongated body portion with a rated break point-type joint wherein said hook portion can be selectively broken off said elongated body portion.

17. A fastening mechanism according to claim 16 further comprising a second multi-use holder mounted at a base end to a bottom portion of said signal generator, said second multi-use holder having an equivalent configuration as said first multi-use holder but with said hook portion removed, said first multi-use holder retaining said hook portion and engaged over an edge of said signal tower in a hanging fashion, said first multi-use holder and said second multi-use holder each laterally clamped, around their respective elongated body portions to said signal tower with a strap retainer.

18. A fastening mechanism according to claim 1 wherein said cover provides at least one recess and said pan provides at least one catch member, said catch member engaging into said recess when said cover is mated to said pan, to releasably lock said cover to said pan.

19. A fastening mechanism according to claim 18 wherein said at least one catch member comprises a catch nose and a catch tongue, and said at least one recess comprises a first recess engageable with said catch nose and a second recess engageable with said catch tongue.

20. A fastening mechanism according to claim 19 wherein said catch tongue can be disengaged from outside of said terminal space with a tool.

* * * * *